United States Patent
Goto

(10) Patent No.: US 12,361,312 B2
(45) Date of Patent: Jul. 15, 2025

(54) ENCODER, CALCULATING DEVICE, AND ENCODING METHOD

(71) Applicant: KABUSHIKI KAISHA TOSHIBA, Tokyo (JP)

(72) Inventor: Hayato Goto, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 18/455,929

(22) Filed: Aug. 25, 2023

(65) Prior Publication Data
US 2024/0289668 A1    Aug. 29, 2024

(30) Foreign Application Priority Data

Feb. 27, 2023  (JP) .................................. 2023-028418
Aug. 4, 2023   (JP) .................................. 2023-127494

(51) Int. Cl.
| G06N 10/70 | (2022.01) |
|---|---|
| G06N 10/20 | (2022.01) |
| G06N 10/40 | (2022.01) |
| H03M 13/31 | (2006.01) |

(52) U.S. Cl.
CPC ............. *G06N 10/70* (2022.01); *G06N 10/20* (2022.01); *H03M 13/31* (2013.01); *G06N 10/40* (2022.01)

(58) Field of Classification Search
CPC ........ G06N 10/70; G06N 10/20; G06N 10/40; H03M 13/31
USPC .............................................. 714/746, 1–14
See application file for complete search history.

(56) References Cited

U.S. PATENT DOCUMENTS

| 11,308,252 B1* | 4/2022 | Piveteau ................. G06F 30/39 |
| 11,551,127 B1* | 1/2023 | Otterbach ............. G06N 10/00 |
| 11,694,104 B2* | 7/2023 | Martinis ................ G06N 10/70 |
| | | 706/45 |
| 11,694,108 B2* | 7/2023 | Tezak ..................... G06N 10/80 |
| | | 703/14 |
| 11,736,122 B1* | 8/2023 | Yoder ............... H03M 13/1125 |
| | | 714/755 |
| 11,966,817 B1* | 4/2024 | Shutty .................... G06N 10/00 |
| 12,007,835 B1* | 6/2024 | Chamberland ........ G06N 10/60 |
| 2018/0269906 A1* | 9/2018 | Haah ................. H03M 13/2906 |

(Continued)

OTHER PUBLICATIONS

H. Ekmel Ercan et al., "Measurement-free implementations of small-scale surface codes for quantum dot qubits," arXiv: 1708:08683v1, XP081291341, 9 pages (2017).

(Continued)

*Primary Examiner* — James C Kerveros
(74) *Attorney, Agent, or Firm* — Finnegan, Henderson, Farabow, Garrett & Dunner, LLP

(57) ABSTRACT

An encoder includes a first element part and a controller. The first element part includes a first qubit, a second qubit coupleable with the first qubit, a third qubit coupleable with the second qubit, a fourth qubit coupleable with the third qubit, a fifth qubit coupleable with the fourth qubit, a sixth qubit coupleable with the fifth qubit, a seventh qubit coupleable with the sixth qubit, an eighth qubit coupleable with the seventh qubit, and a ninth qubit coupleable with the eighth qubit. The controller is configured to perform a first control. The first control includes encoding a surface code having a code distance of 3.

14 Claims, 10 Drawing Sheets

(56) References Cited

U.S. PATENT DOCUMENTS

2019/0044543 A1* 2/2019 Chamberland ..... H03M 13/255
2023/0162077 A1* 5/2023 Hwang ................. G06N 10/20
　　　　　　　　　　　　　　　　　　　　　　　706/62

OTHER PUBLICATIONS

Sascha Hueßen et al., "Strategies for practical advantage of fault-tolerant circuit design in noisy trapped-ion quantum computers," arXiv:2301.10017v1, XP093125954, 36 pages (2023).

K.J. Satzinger et al., "Realizing topologically ordered states on a quantum processor," arXiv:2104.01180v1, XP093125951, 27 pages (2021).

David Layden et al., "Ancilla •free quantum error correction codes for quantum metrology," arXiv:1811.01450v1, XP081045846, 18 pages (2018).

Yu Tomita et al., "Low-distance surface codes under realistic quantum noise," arXiv:1404.3747v3, XP055772242, 15 pages (2014).

Nicolas J. Guerrero et al., "Quantum Error Detection Without Using Ancilla Qubits," arXiv:2204.11114v1, XP091208164, 8 pages (2022).

Austin Fowler et al., "Surface codes: towards practical large-scale quantum computation," Physical Review A, vol. 86, No. 3, pp. 032324-1 to 032324-48, DOI: 10.1103/PhysRevA.86.032324 (2012).

Sebastian Krinner et al., "Realizing repeated quantum error correction in a distance-three surface code," Nature, vol. 605, pp. 669-674 and appx., 2 pages, DOI: 10.1038/s41586-022-04566-8 (2022).

Dolev Bluvstein et al., "a quantum processor based on coherent transport of entangled atom arrays," Nature, vol. 604, pp. 451-456 and appx., 15 pages, DOI: 10.1038/s41586-022-04592-6 (2022).

Hayato Goto et al., "Fault-tolerant quantum computation with a soft-decision decoder for error correction and detection by teleportation," Scientific Reports, DOI: 10.1038/srep02044, 7 pages (2013).

K.J. Satzinger et al., "Realizing topologically ordered states on a quantum processor," Science, vol. 374, No. pp. 1237-1241, DOI: 10.1126/science.abi8378 (2021).

* cited by examiner

ENCODER, CALCULATING DEVICE, AND ENCODING METHOD

CROSS-REFERENCE TO RELATED APPLICATIONS

This application is based upon and claims the benefit of priority from Japanese Patent Application No. 2023-028418, filed on Feb. 27, 2023, and Japanese Patent Application No. 2023-127494, filed on Aug. 4, 2023; the entire contents of which are incorporated herein by reference.

FIELD

Embodiments described herein relate generally to an encoder, a calculating device, and an encoding method.

BACKGROUND

For example, a qubit is encoded in a calculating device or the like. Higher efficiency of the encoding is desirable.

DETAILED DESCRIPTION

Figure 1:
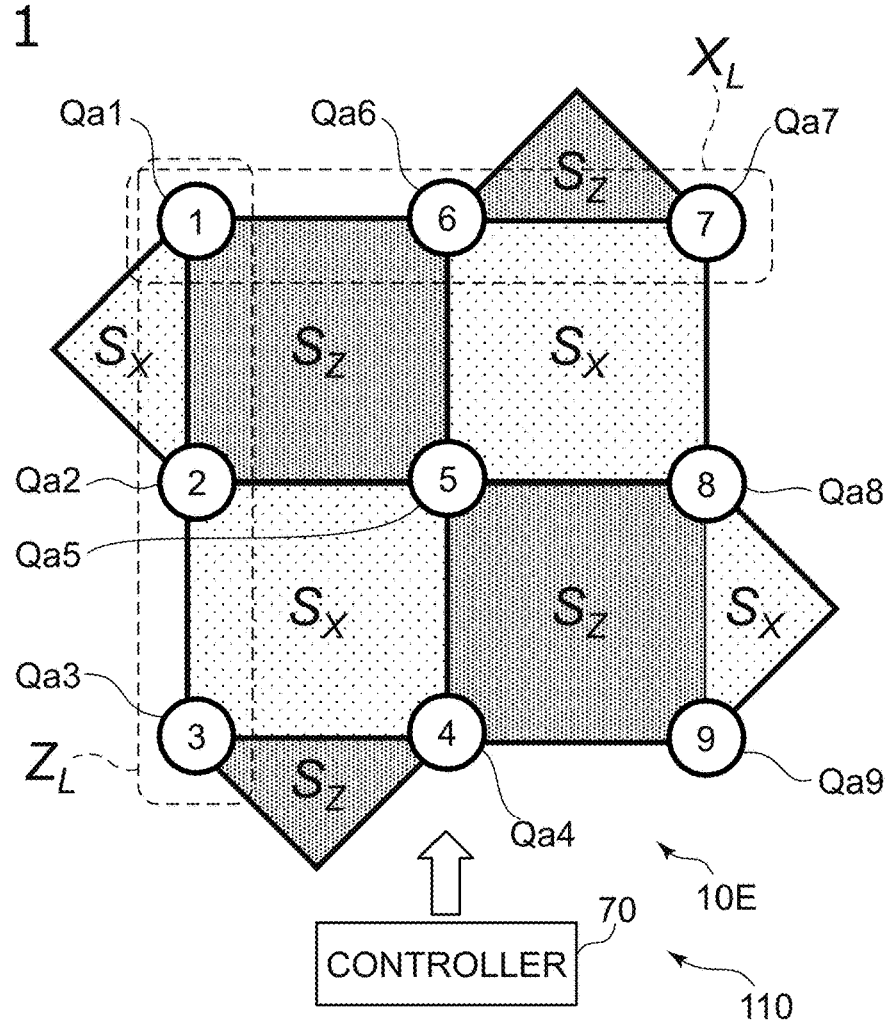
FIG. 1 is a schematic view illustrating an encoder according to a first embodiment.

According to one embodiment, an encoder includes a first element part and a controller. The first element part includes a first qubit, a second qubit coupleable with the first qubit, a third qubit coupleable with the second qubit, a fourth qubit coupleable with the third qubit, a fifth qubit coupleable with the fourth qubit, a sixth qubit coupleable with the fifth qubit, a seventh qubit coupleable with the sixth qubit, an eighth qubit coupleable with the seventh qubit, and a ninth qubit coupleable with the eighth qubit. The controller is configured to perform a first control. The first control includes encoding a surface code having a code distance of 3 by performing a two-qubit gate on the second and first qubits, performing a two-qubit gate on the third and second qubits, performing a two-qubit gate on the fourth and third qubits, performing a two-qubit gate on the fourth and fifth qubits, performing a two-qubit gate on the sixth and fifth qubits, performing a two-qubit gate on the sixth and seventh qubits, performing a two-qubit gate on the seventh and eighth qubits, and performing a two-qubit gate on the eighth and ninth qubits. In the first control, the controller performs the two-qubit gate on the third and second qubits after the two-qubit gate for the second and first qubits and the two-qubit gate for the fourth and third qubits. In the first control, the controller performs the two-qubit gate on the seventh and eighth qubits after the two-qubit gate for the sixth and seventh qubits and the two-qubit gate for the eighth and ninth qubits.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating an encoder according to a first embodiment.

Figure 2:
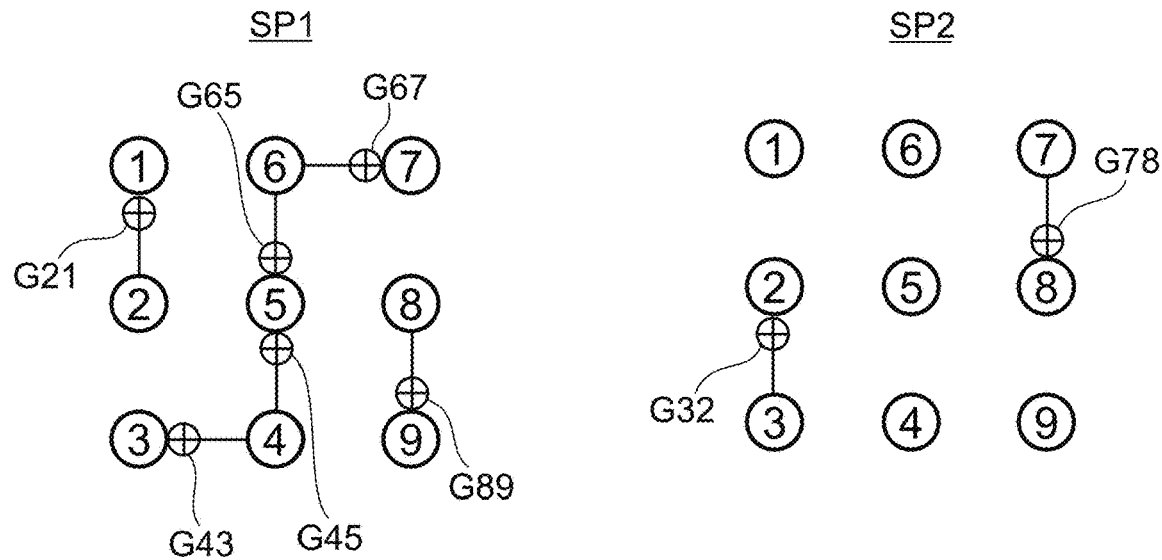
FIG. 2 is a schematic view illustrating a control in the encoder according to the first embodiment.

FIG. 2 is a schematic view illustrating a control in the encoder according to the first embodiment.

FIG. 1 illustrates a concept of a surface code having a code distance of 3.

As shown in FIG. 1, a first element part 10E includes a first qubit Qa1, a second qubit Qa2, a third qubit Qa3, a fourth qubit Qa4, a fifth qubit Qa5, a sixth qubit Qa6, a seventh qubit Qa7, an eighth qubit Qa8, and a ninth qubit Qa9.

The second qubit Qa2 is coupleable with the first qubit Qa1. The third qubit Qa3 is coupleable with the second qubit Qa2. The fourth qubit Qa4 is coupleable with the third qubit Qa3. The fifth qubit Qa5 is coupleable with the fourth qubit Qa4. The sixth qubit Qa6 is coupleable with the fifth qubit Qa5. The seventh qubit Qa7 is coupleable with the sixth qubit Qa6. The eighth qubit Qa8 is coupleable with the seventh qubit Qa7. The ninth qubit Qa9 is coupleable with the eighth qubit Qa8.

As shown in FIG. 1, the encoder 110 according to the embodiment includes the first element part 10E and a controller 70. The controller 70 is configured to perform a first control OP1 (see FIG. 2) on the first element part 10E. The first control OP1 is configured to perform multiple two-qubit gates.

FIG. 2 illustrates multiple two-qubit gates. For example, the multiple two-qubit gates include a two-qubit gate G21 for the second and first qubits Qa2 and Qa1, a two-qubit gate G32 for the third and second qubits Qa3 and Qa2, a two-qubit gate G43 for the fourth and third qubits Qa4 and Qa3, a two-qubit gate G45 for the fourth and fifth qubits Qa4 and Qa5, a two-qubit gate G65 for the sixth and fifth qubits Qa6 and Qa5, a two-qubit gate G67 for the sixth and seventh qubits Qa6 and Qa7, a two-qubit gate G78 for the seventh and eighth qubits Qa7 and Qa8, and a two-qubit gate G89 for the eighth and ninth qubits Qa8 and Qa9.

The first control OP1 includes encoding a surface code having a code distance of 3 by performing the two-qubit gate G21, performing the two-qubit gate G21, performing the two-qubit gate G32, performing the two-qubit gate G43, performing the two-qubit gate G45, performing the two-qubit gate G65, performing the two-qubit gate G67, performing the two-qubit gate G78, and performing the two-qubit gate G89.

According to the embodiment, the sequence of these two-qubit gates is set as follows. According to the embodiment, in the first control OP1, the controller 70 performs the two-qubit gate G32 on the third and second qubits Qa3 and Qa2 after the two-qubit gate G21 for the second and first qubits Qa2 and Qa1 and the two-qubit gate G43 for the fourth and third qubits Qa4 and Qa3.

In the first control OP1, the controller 70 performs the two-qubit gate G78 on the seventh and eighth qubits Qa7 and Qa8 after the two-qubit gate G67 for the sixth and seventh qubits Qa6 and Qa7 and the two-qubit gate G89 for the eighth and ninth qubits Qa8 and Qa9.

For example, as shown in FIG. 2, the first control OP1 includes a first partial control SP1 and a second partial control SP2. These partial controls correspond to steps of the processing. The second partial control SP2 is performed after the first partial control SP1. In the example, the two-qubit gate G21, the two-qubit gate G43, the two-qubit gate G67, and the two-qubit gate G89 are performed in the first partial control SP1. The two-qubit gate G45 and the two-qubit gate G65 may be performed in the first partial control SP1.

As shown in FIG. 2, the two-qubit gate G32 and the two-qubit gate G78 are performed in the second partial control SP2.

Efficient encoding is possible by performing the multiple two-qubit gates in such a sequence. For example, the encoding can be performed by performing a controlled-NOT gate (hereinbelow, CNOT gate) 8 times. According to the embodiment, an encoder can be provided in which the efficiency can be increased.

An example of the encoder 110 will now be described.

Figure 3:
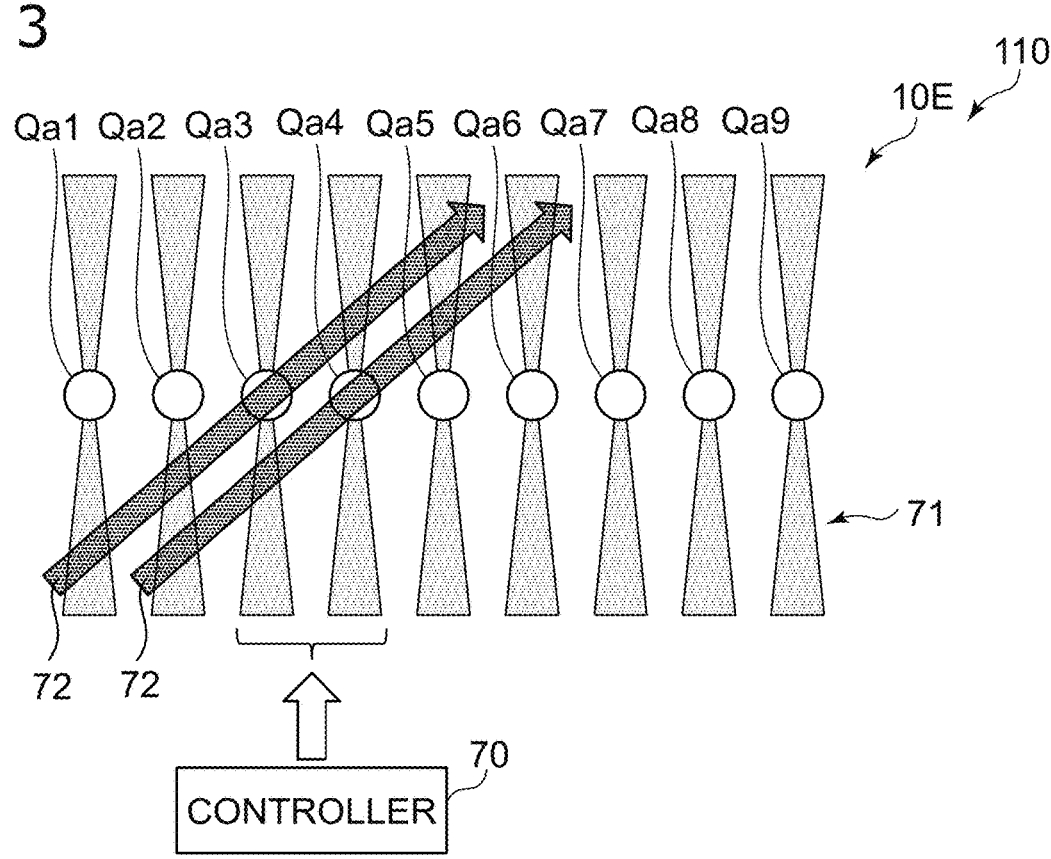
FIG. 3 is a schematic view illustrating the encoder according to the first embodiment.

FIG. 3 is a schematic view illustrating the encoder according to the first embodiment.

Figure 4:
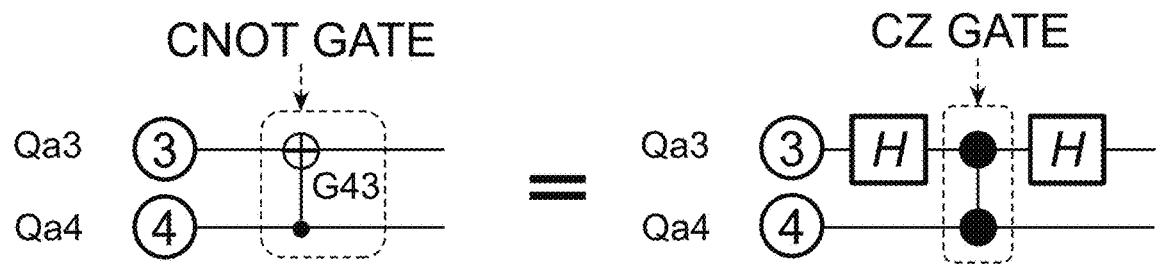
FIG. 4 is a schematic view illustrating a control of the encoder according to the first embodiment.

FIG. 4 is a schematic view illustrating a control of the encoder according to the first embodiment.

In the example of FIG. 3, the quantum states of atoms trapped by light are used as qubits (see Dolev Bluvstein et al., Nature 604, 451 (2022)).

As shown in FIG. 3, the first to ninth qubits Qa1 to Qa9 are included. These qubits each are, for example, one atom. The atoms are, for example, rubidium-87Rb.

The controller 70 irradiates an excitation light 71 (e.g., a laser) onto multiple atoms (the first to ninth qubits Qa1 to Qa9). The controller 70 can perform a controlled-Z gate (hereinbelow, a CZ-gate) by irradiating an operation light 72 (e.g., a laser) on two adjacent atoms.

In the example of FIG. 3, an operation on the third and fourth qubits Qa3 and Qa4 is illustrated. In such a case, the operation light 72 is irradiated on the third and fourth qubits Qa3 and Qa4.

The CZ-gate is an example of a two-qubit gate. In the CZ-gate, the phase is inverted when both of the two qubits are in the "1 state".

As shown in FIG. 4, for example, a CZ-gate interposed between two Hadamard gate Hs is the equivalent of a CNOT gate. In the CZ-gate, the operation on the two qubits is symmetric (vertically in FIG. 4). Two successive Hadamard gates H are equivalent to the state before the operation, and are therefore omitted.

A CNOT gate is another example of a two-qubit gate. In the CNOT gate, nothing is performed when the controlled qubit is in the "0 state", and the previous state is maintained; on the other hand, when the controlled qubit is in the "1 state", the "0 state" of the target qubit is flipped to the "1 state", or the "1 state" of the target qubit is flipped to the "0 state". According to the embodiment, in the surface code having the code distance of 3 as shown in FIG. 1, nine qubits include four X-stabilizer operators $S_x$ and four Z-stabilizer operators $S_z$. The four X-stabilizer operators $S_x$ include the $X_1X_2$ operator, the $X_2X_3X_4X_5$ operator, the $X_5X_6X_7X_8$ operator, and the $X_8X_9$ operator. The four Z-stabilizer operators $S_z$ include the $Z_6Z_7$ operator, the $Z_1Z_2Z_5Z_6$ operator, the $Z_4Z_5Z_8Z_9$ operator, and the $Z_3Z_4$ operator. In the encoded state of the surface code having the code distance of 3, the nine qubits are in simultaneous eigenstates for which the eigenvalues of the eight stabilizer operators are "1". In the surface code having the code distance of 3, an encoded Z-operator $Z_L$ corresponds to the $Z_1Z_2Z_3$ operator. An encoded X-operator $X_L$ corresponds to the $X_1X_6X_7$ operator. In the "encoded 0 state" of the surface code having the code distance of 3, the nine qubits are in eigenstates for which the eigenvalue of the encoded Z-operator $Z_L$ is "1".

For example, there is an encoding method of a first reference example for the nine qubits illustrated in FIG. 1. In the first reference example, first, the nine qubits are set to the "0 state" as a preparatory control. In the "0 state", the qubits are in eigenstates for which the eigenvalues of the Z-operators are "1". Subsequently, measurements for the four X-stabilizer operators $S_x$ are repeated 3 times to measure the error. Such a first reference example requires a CNOT gate performed 36 times, four ancilla qubits, and readout performed 12 times. The stabilizer measurements are, for example, syndrome measurements.

In contrast, according to the embodiment, for example, the encoding can be performed by performing a CNOT gate 8 times.

Figure 5:
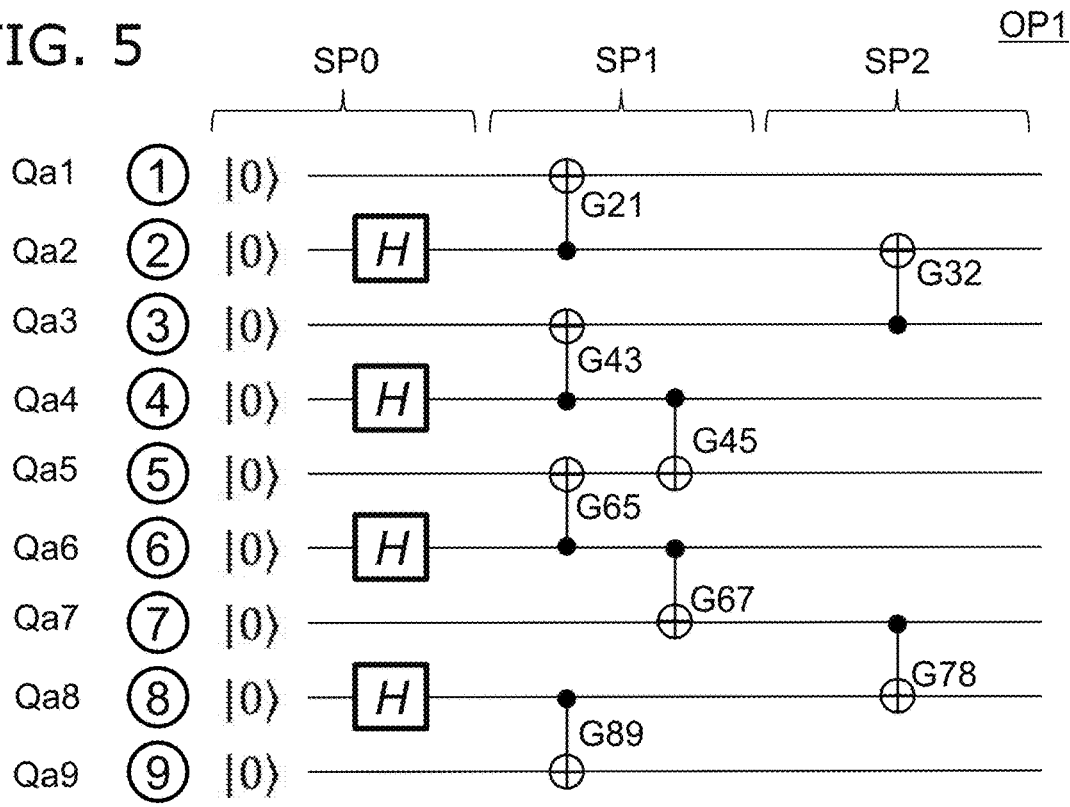
FIG. 5 is a schematic view illustrating a control of the encoder according to the first embodiment.
Figure 6:
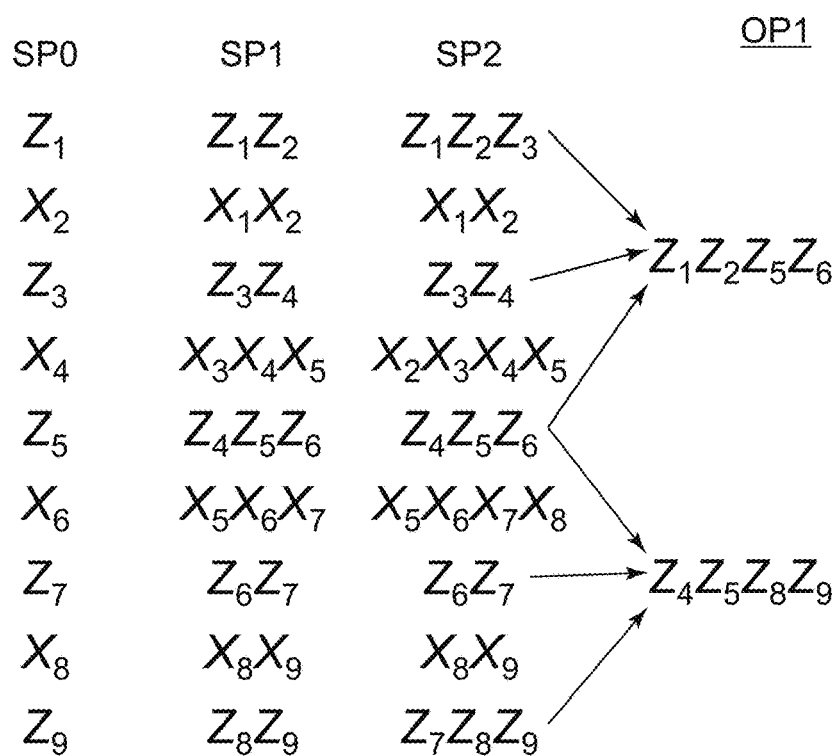
FIG. 6 is a schematic view illustrating a control of the encoder according to the first embodiment.

FIGS. 5 and 6 are schematic views illustrating a control of the encoder according to the first embodiment.

As shown in FIG. 5, the calculations of the first partial control SP1 and the second partial control SP2 are performed on the first qubit Qa1, the second qubit Qa2, the third qubit Qa3, the fourth qubit Qa4, the fifth qubit Qa5, the sixth qubit Qa6, the seventh qubit Qa7, the eighth qubit Qa8, and the ninth qubit Qa9 (see FIG. 6).

A pre-partial control SP0 may be performed before the first partial control SP1. In the pre-partial control SP0, the nine qubits are set to the |0> state. In the pre-partial control SP0, the Hadamard gate H may be performed on the second qubit Qa2, the fourth qubit Qa4, the sixth qubit Qa6, and the eighth qubit Qa8. FIG. 4 illustrates the changes of the stabilizers.

According to the embodiment as described above, the two-qubit gate G32 is performed after the two-qubit gates G43 and G21. The two-qubit gate G78 is performed after the two-qubit gates G67 and G89. These two-qubit gates are, for example, CNOT gates.

In the CNOT gate, for example, a two-qubit gate Gij is performed on the ith and jth qubits Qai and Qaj. "i" is an integer of 1 to 9. "j" is (i±1) and is a positive integer. Performing the two-qubit gate Gij includes causing the state of the jth qubit Qaj to transition to another state when the state of the ith qubit Qai is one of a first state or a second state (e.g., the first state), and maintaining the state of the jth qubit Qaj when the state of the ith qubit Qai is the other of the first state or the second state (e.g., the second state).

For example, performing the two-qubit gate G43 on the fourth and third qubits Qa4 and Qa3 includes causing the state of the third qubit Qa3 to transition to another state when the state of the fourth qubit Qa4 is the one state (e.g., the first state), and maintaining the state of the third qubit Qa3 when the state of the fourth qubit Qa4 is the other state (e.g., the second state).

According to the embodiment, highly fault-tolerant encoding is possible. In the first partial control SP1, the "weights" of the stabilizers are not more than 3. Therefore, the number of errors can be considered to be not more than 1. Errors having a "weight" of 2 that occur in the CNOT gate in the second partial control SP2 are correctable and are practically not problematic. The "weight" corresponds to the number of Pauli operators other than the identity operator.

In the example of FIG. 2, the first control OP1 includes the first partial control SP1, and the second partial control SP2 after the first partial control SP1. The first partial control SP1 includes performing the two-qubit gate G21, performing the two-qubit gate G43, performing the two-qubit gate G45, performing the two-qubit gate G65, performing the two-qubit gate G67, and performing the two-qubit gate G89. In the example of FIG. 2, the second partial control SP2 includes performing the two-qubit gate G32 and performing the two-qubit gate G78.

Figure 7:
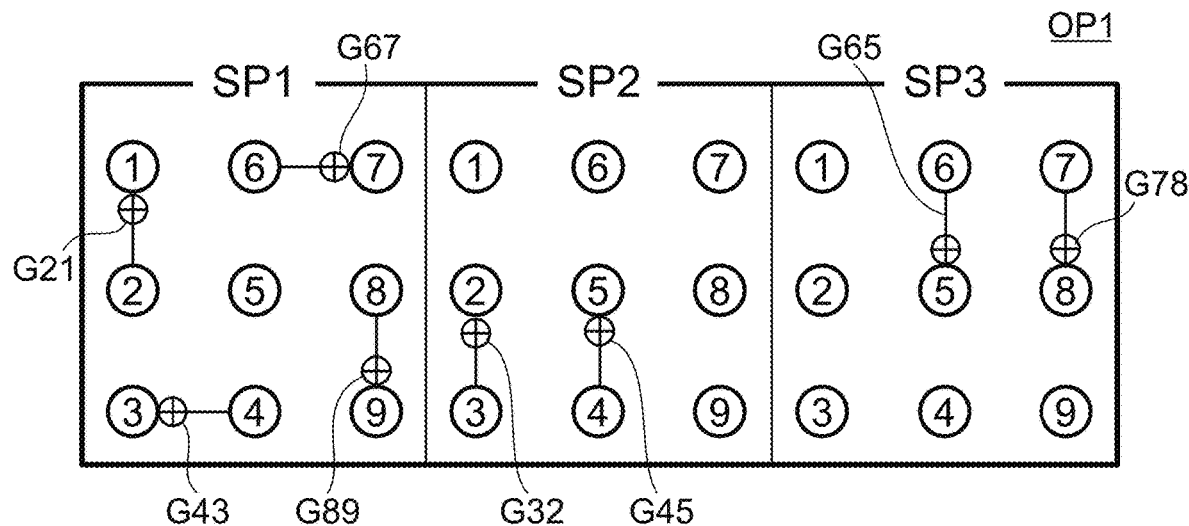
FIG. 7 is a schematic view illustrating controls of the encoder according to the first embodiment.
Figure 8:
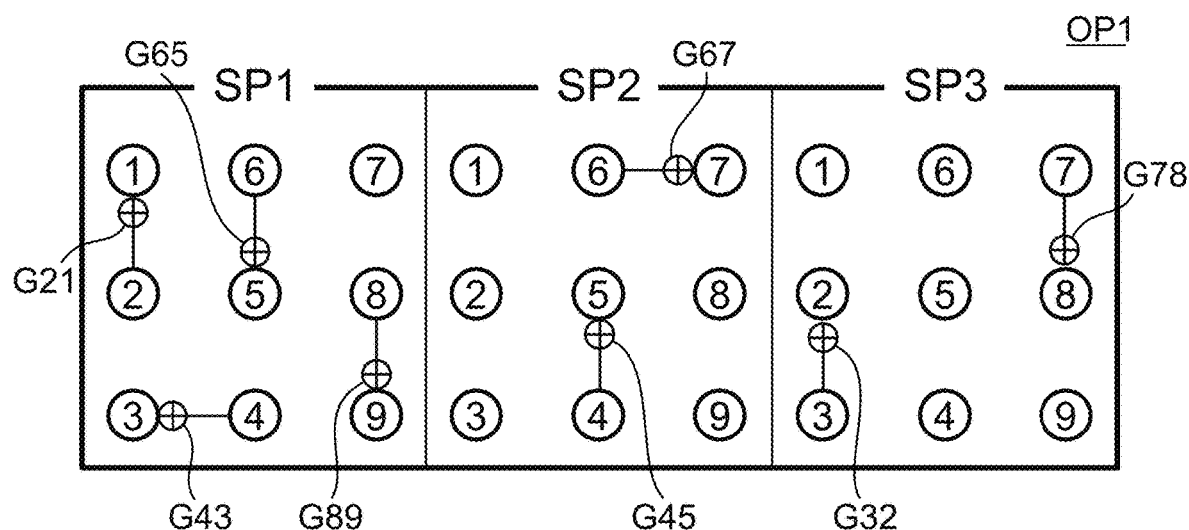
FIG. 8 is a schematic view illustrating controls of the encoder according to the first embodiment.

FIGS. 7 and 8 are schematic views illustrating controls of the encoder according to the first embodiment. In these examples as shown in FIGS. 7 and 8, the first control OP1 includes the first partial control SP1, the second partial control SP2 after the first partial control SP1, and a third partial control SP3 after the second partial control SP2.

In the example of FIG. 7, the first partial control SP1 includes performing the two-qubit gate G21, performing the two-qubit gate G43, performing the two-qubit gate G67, and performing the two-qubit gate G89. The second partial control SP2 includes performing the two-qubit gate G32 and performing the two-qubit gate G45. The third partial control SP3 includes performing the two-qubit gate G65 and performing the two-qubit gate G78. Efficient encoding is possible in the example of FIG. 5 as well.

In the example of FIG. 8, the first partial control SP1 includes performing the two-qubit gate G21, performing the two-qubit gate G43, performing the two-qubit gate G65, and performing the two-qubit gate G89. The second partial control SP2 includes performing the two-qubit gate G45 and performing the two-qubit gate G67. The third partial control SP3 includes performing the two-qubit gate G32 and performing the two-qubit 10 gate G78. Efficient encoding is possible in the example of FIG. 8 as well.

Second Embodiment

Figure 9:
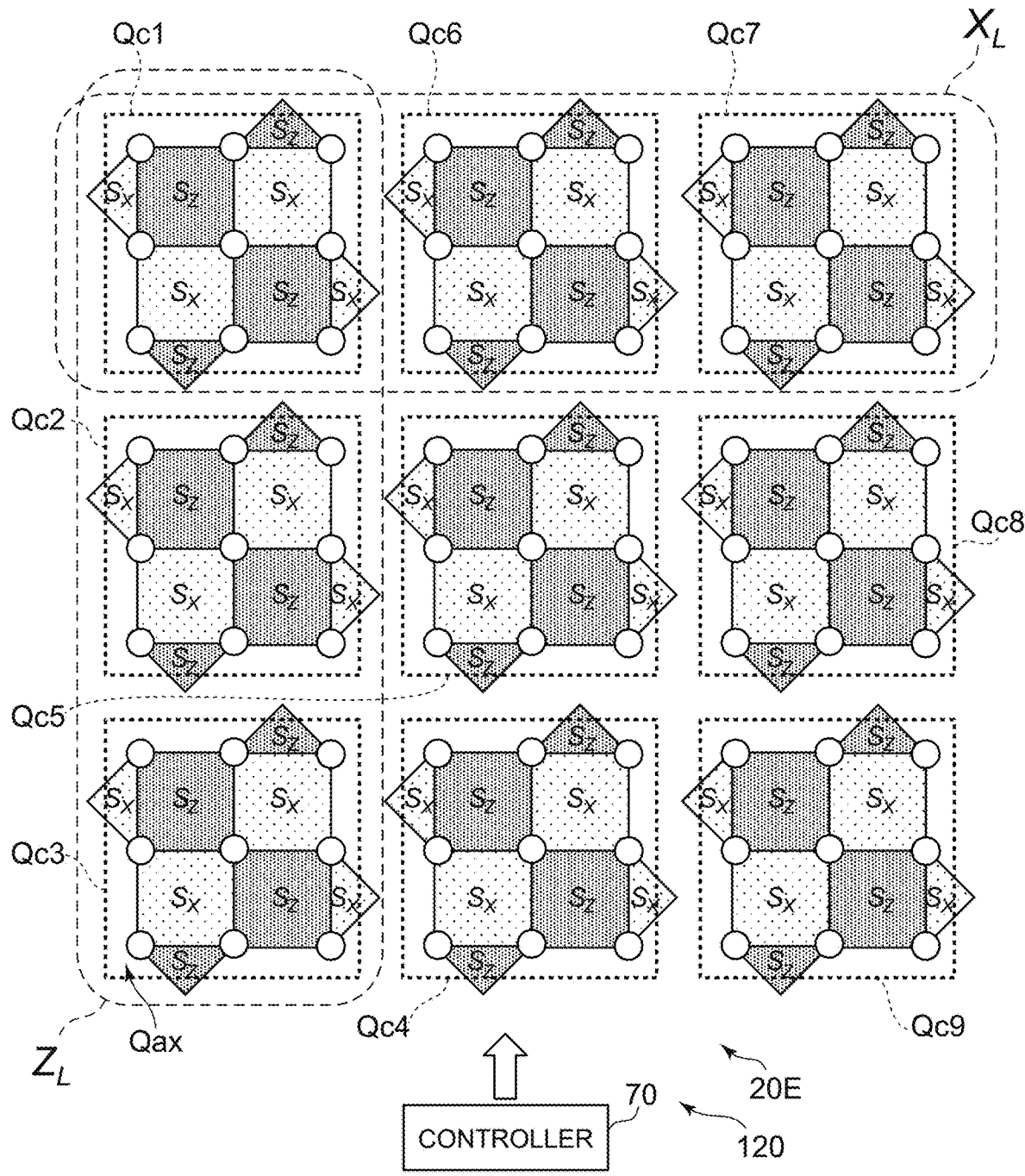
FIG. 9 is a schematic view illustrating an encoder according to a second embodiment.

FIG. 9 is a schematic view illustrating an encoder according to a second embodiment.

As shown in FIG. 9, the encoder 120 according to the embodiment includes an encoded element part 20E and the controller 70. FIG. 9 illustrates a concept of a code in which two surface codes having code distances of 3 are concatenated.

An example when the quantum states of atoms trapped by light are used as qubits will now be described.

Figure 10:
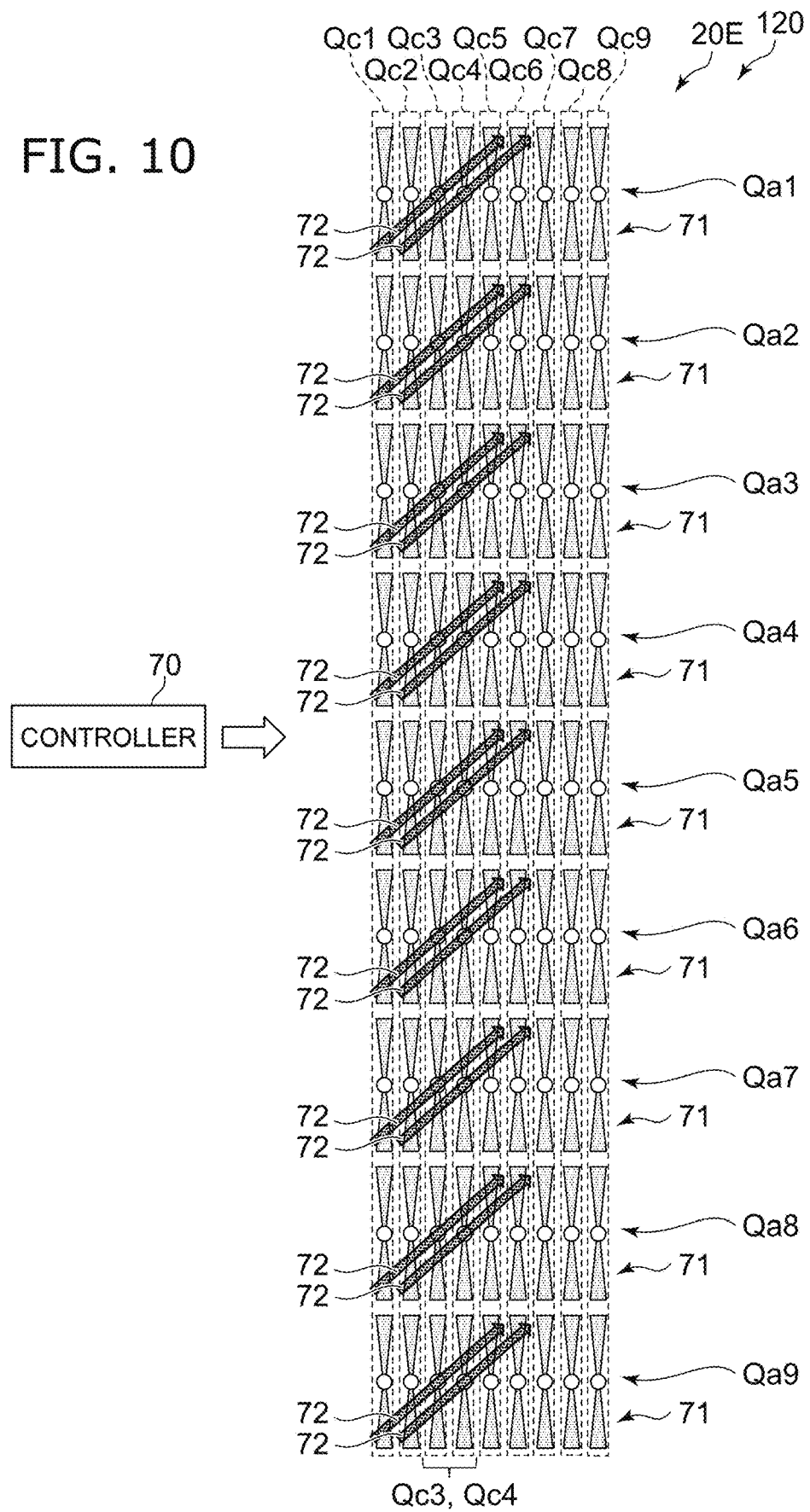
FIG. 10 is a schematic view illustrating the encoder according to the second embodiment.

FIG. 10 is a schematic view illustrating the encoder according to the second embodiment.

FIG. 10 illustrates when the code distance is 3 (i.e., the code distance N is 3). As shown in FIG. 10, the encoded element part 20E includes a first encoded qubit Qc1 having the code distance of N, a second encoded qubit Qc2 having the code distance of N, a third encoded qubit Qc3 having the code distance of N, a fourth encoded qubit Qc4 having the code distance of N, a fifth encoded qubit Qc5 having the code distance of N, a sixth encoded qubit Qc6 having the code distance of N, a seventh encoded qubit Qc7 having the code distance of N, an eighth encoded qubit Qc8 having the code distance of N, and a ninth encoded qubit Qc9 having the code distance of N.

The second encoded qubit Qc2 is coupleable with the first encoded qubit Qc1. The third encoded qubit Qc3 is coupleable with the second encoded qubit Qc2. The fourth encoded qubit Qc4 is coupleable with the third encoded qubit Qc3. The fifth encoded qubit Qc5 is coupleable with the fourth encoded qubit Qc4. The sixth encoded qubit Qc6 is coupleable with the fifth encoded qubit Qc5. The seventh encoded qubit Qc7 is coupleable with the sixth encoded qubit Qc6. The eighth encoded qubit Qc8 is coupleable with the seventh encoded qubit Qc7. The ninth encoded qubit Qc9 is coupleable with the eighth encoded qubit Qc8.

In the example, the first to ninth encoded qubits Qc1 to Qc9 included in the encoded element part 20E each include the first element part 10E (see FIG. 1). The code of level 1 corresponds to the code of the first element part 10E (the first to ninth qubits Qa1 to Qa9). The code of level 2 corresponds to the code of the encoded element part 20E (the first to ninth encoded qubits Qc1 to Qc9).

Hereinbelow, the code of level 1 of the concatenated code is taken to be a surface code having a code distance of 3. According to the embodiment, any code having a code distance of N may be utilized. "N" is an integer not less than 2. The code of level 2 of the concatenated code is a surface code having a code distance of 3.

An example of encoding the encoder 120 will now be described.

Figure 11:
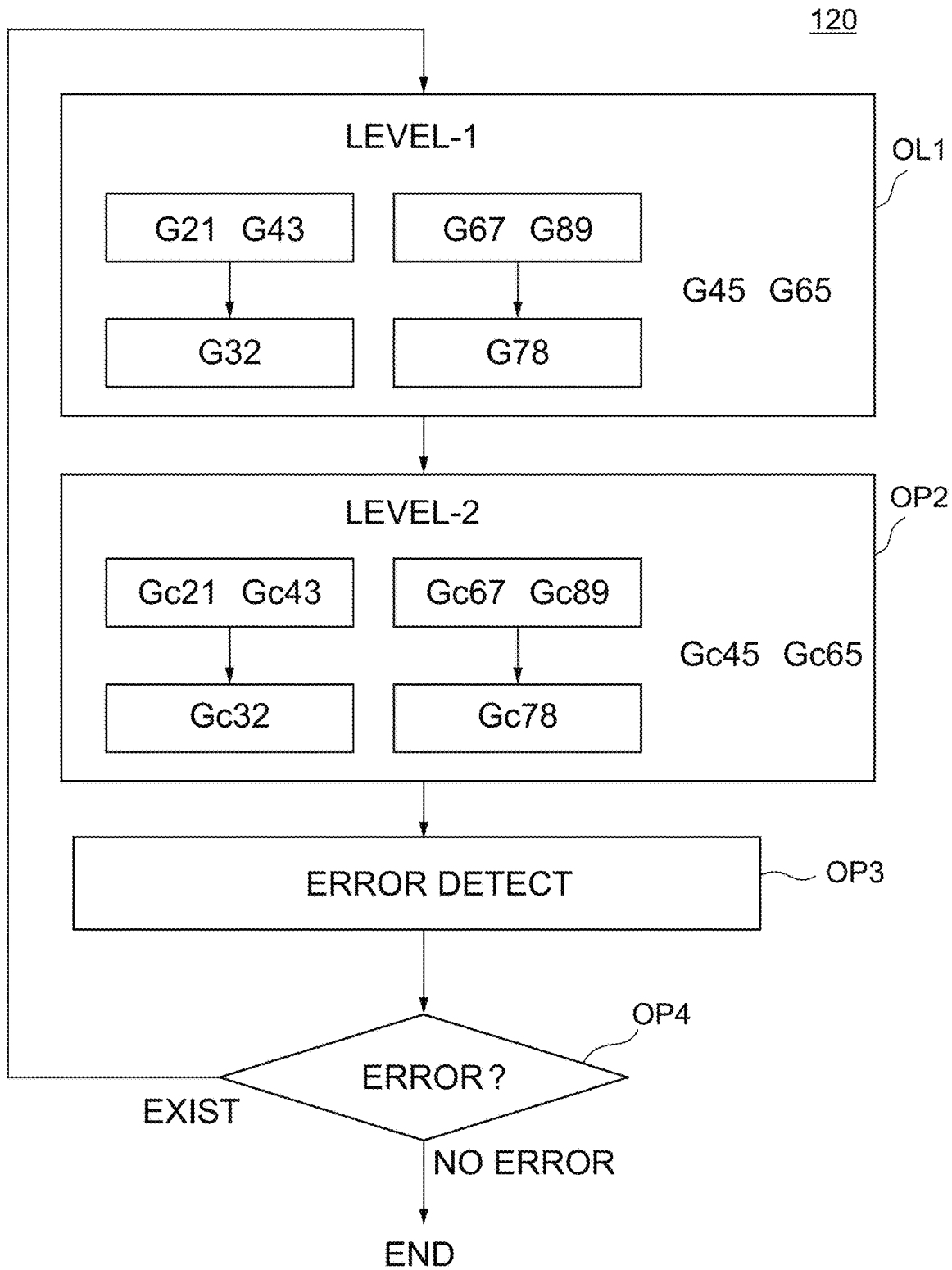
FIG. 11 is a flowchart illustrating a control of the encoder according to the second embodiment.

FIG. 11 is a flowchart illustrating a control of the encoder according to the second embodiment.

As shown in FIG. 11, the controller 70 is configured to perform a second control OP2 and a third control OP3. The second control OP2 corresponds to the encoding of level 2. The third control OP3 corresponds to an error detection control. The controller 70 is configured to perform a first level encoding control OL1 before the second control OP2.

Figure 12:
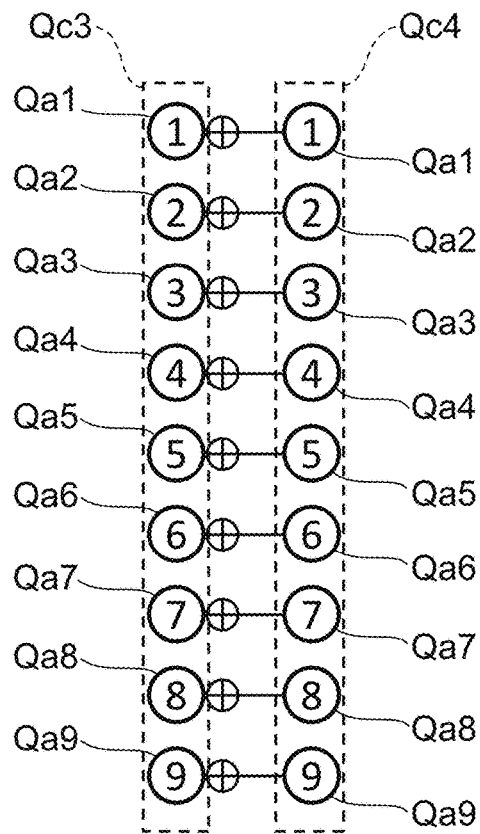
FIG. 12 is a schematic view illustrating a portion of the control of the encoder according to the second embodiment.

FIG. 12 is a schematic view illustrating a portion of the control of the encoder according to the second embodiment. FIG. 12 illustrates the first level encoding control OL1. FIG. 12 illustrates the first level encoding control OL1 on the third and fourth encoded qubits Qc3 and Qc4.

As shown in FIG. 12, the third encoded qubit Qc3 includes the first to ninth qubits Qa1 to Qa9 of the third encoded qubit Qc3. The fourth encoded qubit Qc4 includes the first to ninth qubits Qa1 to Qa9 of the fourth encoded qubit Qc4. For example, the encoded CNOT gate of level 1 is performed between the first to ninth qubits Qa1 to Qa9 included in the third encoded qubit Qc3 and the first to ninth qubits Qa1 to Qa9 included in the fourth encoded qubit Qc4. The encoded CNOT gate of level 1 corresponds to a "transversal CNOT". According to the embodiment, encoded CZ-gates may be similarly performed to FIG. 12.

The encoding illustrated in FIG. 12 is performed on two other encoded qubits. At this time, in the first level encoding control OL1, the controller 70 performs the two-qubit gate G32 after the two-qubit gates G21 and G43. In the first level encoding control OL1, the controller 70 performs the two-qubit gate G78 after the two-qubit gates G67 and G89. Such a first level encoding control OL1 is performed on all nine level-1 encoded qubits.

In the example of FIG. 12, the code of level 1 is a surface code having a code distance of 3. When the code of level 1 has a code distance of N, the first level encoding control OL1 is modified and performed according to the code distance of N.

Figure 13A:
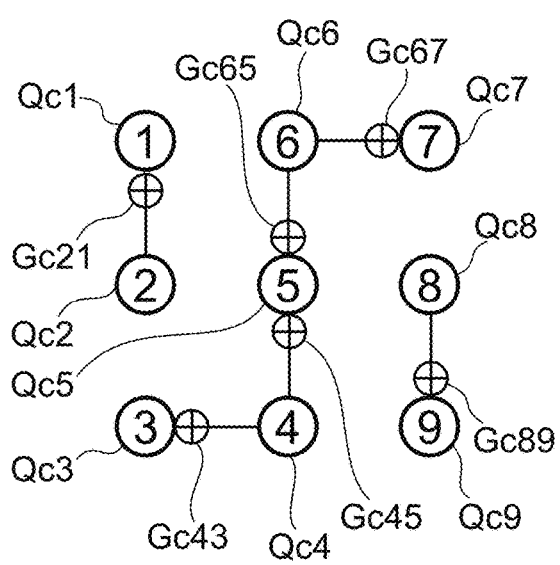
FIG. 13A and FIG. 13B are schematic views illustrating the control of the encoder according to the second embodiment.
Figure 13B:
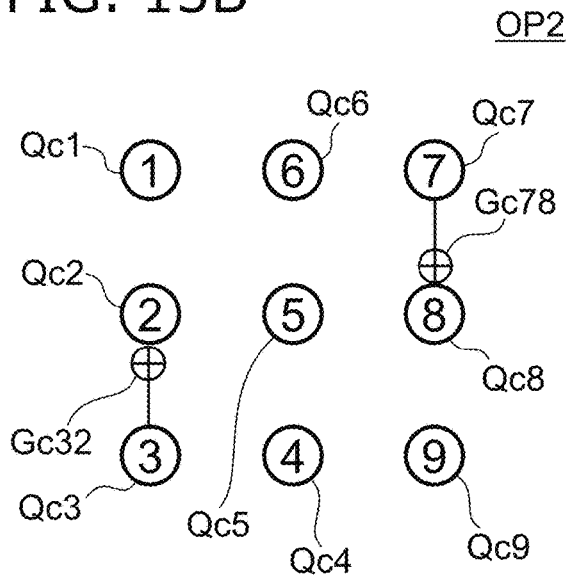

As shown in FIG. 11, the controller 70 performs the second control OP2 after the first level encoding control OL1. FIGS. 13A and 13B are schematic views illustrating the control of the encoder according to the second embodiment. The second control OP2 includes performing an encoded two-qubit gate Gc21 on the second and first encoded qubits Qc2 and Qc1 (see FIG. 13A). The second control OP2 includes performing an encoded two-qubit gate Gc32 on the third and second encoded qubits Qc3 and Qc2 (see FIG. 13B). The second control OP2 includes performing an encoded two-qubit gate Gc43 on the fourth and third encoded qubits Qc4 and Qc3 (see FIG. 13A). The second control OP2 includes performing an encoded two-qubit gate Gc45 on the fourth and fifth encoded qubits Qc4 and Qc5 (see FIG. 13A). The second control OP2 includes performing an encoded two-qubit gate Gc65 on the sixth and fifth encoded qubits Qc6 and Qc5 (see FIG. 13A). The second control OP2 includes performing an encoded two-qubit gate Gc67 on the sixth and seventh encoded qubits Qc6 and Qc7 (see FIG. 13A). The second control OP2 includes performing an encoded two-qubit gate Gc78 on the seventh and eighth encoded qubits Qc7 and Qc8 (see FIG. 13B). The second control OP2 includes performing an encoded two-qubit gate Gc89 on the eighth and ninth encoded qubits Qc8 and Qc9 (see FIG. 13A).

By the multiple encoded two-qubit gates described above, the second control OP2 includes encoding the code having the code distance of N and the surface code having the code distance of 3 into a concatenated code having a code distance of 3N.

FIG. 10 illustrates a portion of the second control OP2. The controller 70 irradiates the excitation light 71 on the first to ninth qubits Qa1 to Qa9 (see FIG. 2, etc.) included in each of the first to ninth encoded qubits Qc1 to Qc9. The controller 70 can perform a CZ-gate by irradiating the operation light 72 (e.g., the laser) on two adjacent atoms.

FIG. 10 illustrates operations on the third and fourth encoded qubits Qc3 and Qc4. In such a case, the operation light 72 is irradiated on the third and fourth encoded qubits Qc3 and Qc4. Encoded CZ-gates are performed on the third and fourth encoded qubits Qc3 and Qc4.

As shown in FIG. 11, in the second control OP2, the controller 70 performs the encoded two-qubit gate Gc32 after the encoded two-qubit gates Gc21 and Gc43. In the second control OP2, the controller 70 performs the encoded two-qubit gate Gc78 after the encoded two-qubit gates Gc67 and Gc89.

As shown in FIG. 11, the controller 70 performs the third control OP3 after the second control OP2.

The third control OP3 includes detecting an error in at least one of the second encoded qubit Qc2, the third encoded qubit Qc3, or the fourth encoded qubit Qc4 and in at least one of the sixth encoded qubit Qc6, the seventh encoded qubit Qc7, or the eighth encoded qubit Qc8.

The controller 70 determines the existence or absence of an error (a fourth control OP4). When an error exists, the flow returns to the first level encoding control OL1 (or the second control OP2). When no error exists, the encoding ends. The controller 70 repeats the second control OP2 and the third control OP3 until an error is not detected.

Figure 14:
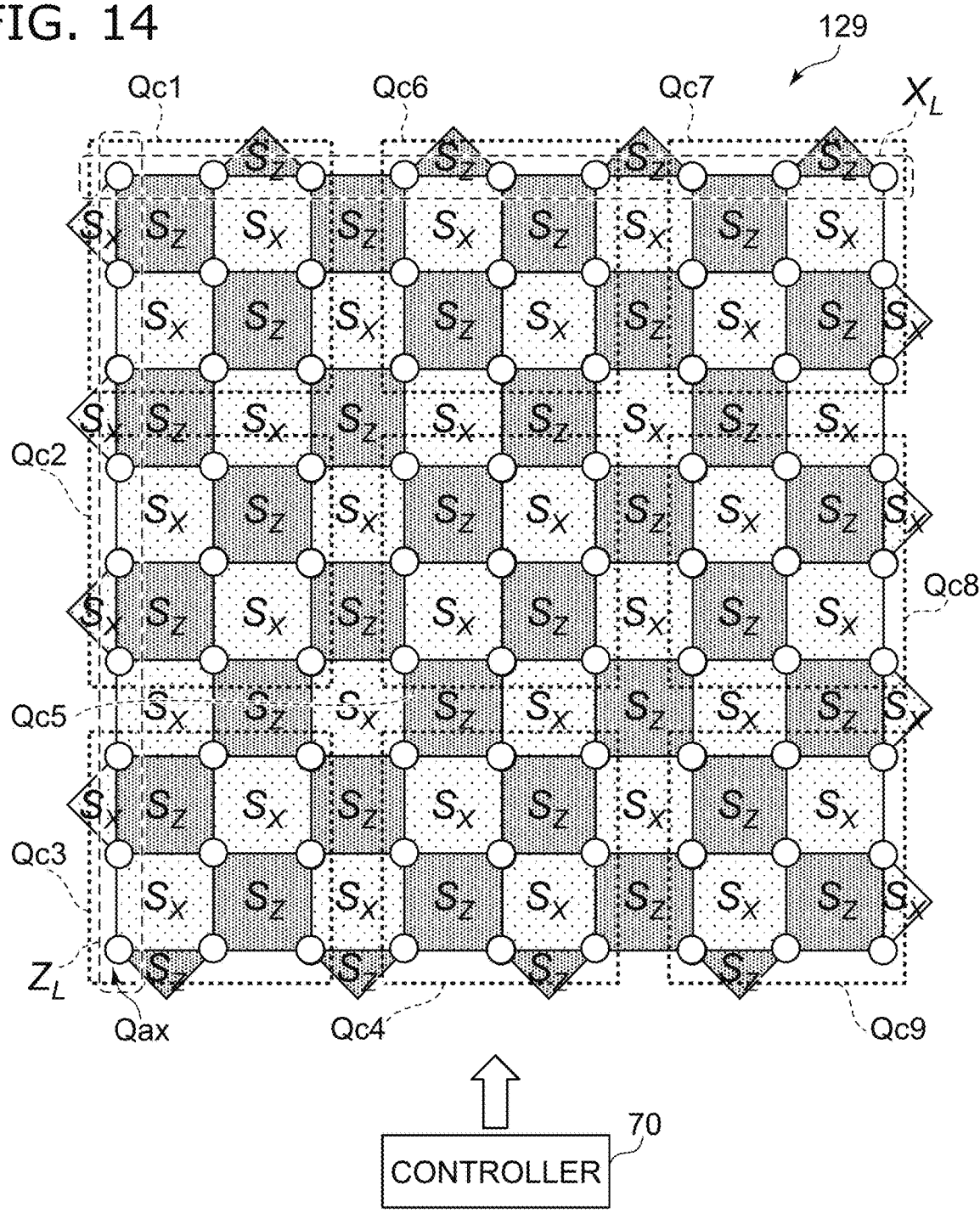
FIG. 14 is a schematic view illustrating an encoder of a reference example.

FIG. 14 is a schematic view illustrating an encoder of a reference example.

In an encoder 129 of a second reference example as shown in FIG. 14, "N" is 3. In such a case, the code distance is 9. 9×9 (81) qubits Qax are provided. In the eighty-one qubits Qax, when the surface code having a code distance of 9 is in the "0 state", the forty X-stabilizer operators $S_x$, the forty Z-stabilizer operators $S_z$, and the encoded Z-operator $Z_L$ are in simultaneous eigenstates having eigenvalues of "1".

In the second reference example, first, the eighty-one qubits Qax are set to the "0 state" as a preparatory control. In the "0 state", the qubits Qax are in eigenstates in which the eigenvalue of the Z-operator is "1". Then, the measurements of the forty X-stabilizer operators $S_x$ are repeated 9 times each, and the error is estimated. The measurements of the forty X-stabilizer operators $S_x$ require a CNOT gate performed 1242 times, forty ancilla qubits, and readout performed 360 times.

In contrast, according to the embodiment, the encoding can be performed efficiently by the second and third controls OP2 and OP3.

As described above, the first to ninth encoded qubits Qc1 to Qc9 each include the first element part 10E (see FIG. 1). As described above, the first element part 10E includes the first qubit Qa1, the second qubit Qa2 coupleable with the first qubit Qa1, the third qubit Qa3 coupleable with the second qubit Qa2, the fourth qubit Qa4 coupleable with the third qubit Qa3, the fifth qubit Qa5 coupleable with the fourth qubit Qa4, the sixth qubit Qa6 coupleable with the fifth qubit Qa5, the seventh qubit Qa7 coupleable with the sixth qubit Qa6, the eighth qubit Qa8 coupleable with the seventh qubit Qa7, and the ninth qubit Qa9 coupleable with the eighth qubit Qa8 (see FIG. 1).

According to the second embodiment, the first level encoding control OL1 that is performed by the controller 70 corresponds to the first control OP1 described with reference to the first embodiment. As described with reference to the first embodiment, the first control OP1 includes the two-qubit gate G21 for the second and first qubits Qa2 and Qa1, the two-qubit gate G32 for the third and second qubits Qa3 and Qa2, the two-qubit gate G43 for the fourth and third qubits Qa4 and Qa3, the two-qubit gate G45 for the fourth and fifth qubits Qa4 and Qa5, the two-qubit gate G65 for the sixth and fifth qubits Qa6 and Qa5, the two-qubit gate G67 for the sixth and seventh qubits Qa6 and Qa7, the two-qubit gate G78 for the seventh and eighth qubits Qa7 and Qa8, and the two-qubit gate G89 for the eighth and ninth qubits Qa8 and Qa9.

The first control OP1 includes encoding a surface code having a code distance of 3 by performing the two-qubit gate G21, performing the two-qubit gate G32, performing the two-qubit gate G43, performing the two-qubit gate G45, performing the two-qubit gate G65, performing the two-qubit gate G67, performing the two-qubit gate G78, and performing the two-qubit gate G89. The code that has a code distance of N is a surface code having a code distance of 3.

As described above, in the first control OP1, the controller 70 performs the two-qubit gate G32 after the two-qubit gates G21 and G43. In the first control OP1, the controller 70 performs the two-qubit gate G78 after the two-qubit gates G67 and G89.

In the encoder 120, the third control OP3 may further include detecting an error in the fifth encoded qubit Qc5. More efficient encoding can be performed.

In the third control OP3 according to the embodiment, an error detection may be performed for the second encoded qubit Qc2, the fifth encoded qubit Qc5, and the eighth encoded qubit Qc8. More efficient encoding can be performed. In such a case as well, the second control OP2 includes encoding a code having a code distance of 3N formed by concatenating a code having a code distance of N and the surface code having a code distance of 3. In the second control OP2, the controller 70 performs the encoded two-qubit gate Gc32 after the encoded two-qubit gates Gc21 and Gc43. In the second control OP2, the controller 70 performs the encoded two-qubit gate Gc78 after the encoded two-qubit gates Gc67 and Gc89. The controller 70 performs the third control OP3 after the second control OP2. The third control OP3 includes detecting an error in the second encoded qubit Qc2, the fifth encoded qubit Qc5, and the eighth encoded qubit Qc8. In such a case as well, the controller 70 determines whether or not an error exists (the fourth control OP4). When an error exists, the flow returns to the second control OP2. The controller 70 repeats the first level encoding control OL1 (or the second control OP2) and the third control OP3 until an error is not detected. Efficient encoding can be performed.

Figure 15:
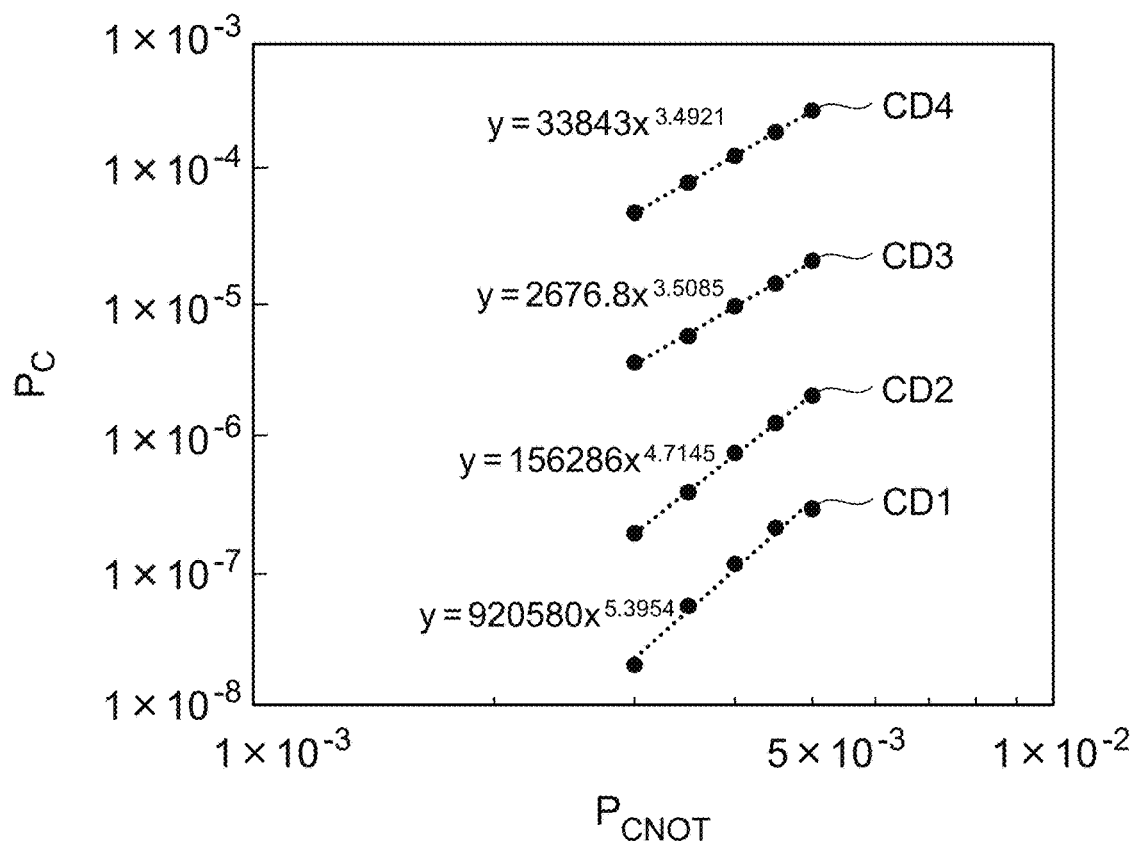
FIG. 15 is a graph illustrating characteristics of the encoder.

FIG. 15 is a graph illustrating characteristics of the encoder. FIG. 15 is simulation results of an encoder corresponding to a code distance of 3 (i.e., N=3) (see FIG. 9). FIG. 15 illustrates simulation results of the decoding error probability for four types of conditions. In a first condition CD1, error detection is performed for the second encoded qubit Qc2, the fifth encoded qubit Qc5, and the eighth encoded qubit Qc8 (see Error-detecting teleportation: EDT, H. Goto and H. Uchikawa, Scientific Reports 3, 2044 (2013) Fault-tolerant quantum computation with a soft-decision decoder for error correction and detection by teleportation | Scientific Reports (nature.com)). In a second condition CD2, error detection is performed for the second and eighth encoded qubits Qc2 and Qc8. In a third condition CD3, error detection is performed for the fifth encoded qubit Qc5. In a fourth condition CD4, error detection is not performed. The horizontal axis of FIG. 15 is an error probability PCNOT of the CNOT gate. The vertical axis of FIG. 15 is a decoding error probability Pc. FIG. 15 illustrates function formulas calculated for the four conditions.

As shown in FIG. 15, compared to the fourth condition CD4, a low decoding error probability Pc is obtained for the third condition CD3. For the first condition CD1, the exponent of the function formula is 5.3954. For the second condition CD2, the exponent of the function formula is 4.7145. For the third condition CD3, the exponent of the function formula is 3.5085. For the fourth condition CD4, the exponent of the function formula is 3.4921. The exponent of the second condition CD2 is improved compared to the third condition CD3. The exponent of the first condition CD1 is improved compared to the second condition CD2.

A lower decoding error probability Pc is obtained for the second condition CD2 than for the third condition CD3. A lower decoding error probability Pc is obtained for the first condition CD1 than for the second condition CD2.

According to the embodiment, it is favorable to employ the first condition CD1 or the second condition CD2. A low decoding error probability Pc is obtained.

Third Embodiment

Figure 16:
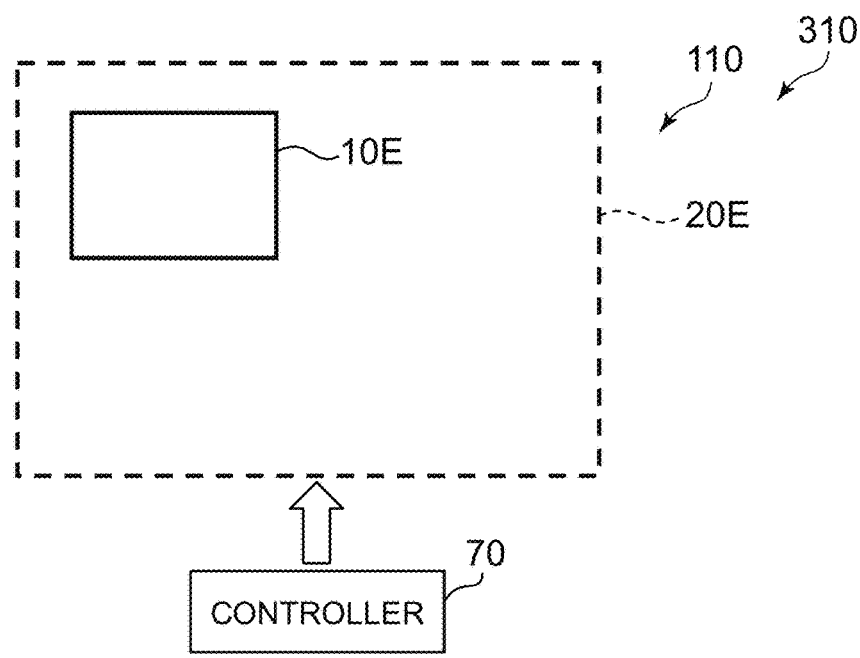
FIG. 16 is a schematic view illustrating a calculating device according to a third embodiment.

FIG. 16 is a schematic view illustrating a calculating device according to a third embodiment.

As shown in FIG. 16, the calculating device 310 according to the embodiment includes the encoder (e.g., the encoder 110) according to the embodiment. The calculating device 310 includes, for example, the first element part 10E.

In the calculating device 310, for example, the states of the first to ninth qubits Qa1 to Qa9 correspond to quantum states of atoms trapped by light.

The calculating device 310 may include, for example, the encoded element part 20E. For example, the encoded qubits obtained by the second and third controls OP2 and OP3 are used in the calculation.

Fourth Embodiment

A fourth embodiment relates to an encoding method. The encoding method according to the embodiment may include the control of the controller 70 described with reference to the first and second embodiments.

In the encoding method according to the embodiment, for example, the first control OP1 that encodes a surface code having a code distance of 3 is performed on the first element part 10E. As described above, the first element part 10E includes the first to ninth qubits Qa1 to Qa9. In the first control OP1, the two-qubit gate G32 is performed after the two-qubit gates G21 and G43 (see FIG. 2). In the first processing (the first control OP1), the two-qubit gate G78 is performed after the two-qubit gates G67 and G89 (see FIG. 2).

According to the third embodiment, the control described with reference to FIG. 11 may be performed. According to the embodiment, an encoding method can be provided in which the efficiency can be increased.

Embodiments may include the following configurations (e.g., technological proposals).

Configuration 1

An encoder, comprising:
a first element part; and
a controller,
the first element part including
a first qubit,
a second qubit coupleable with the first qubit,
a third qubit coupleable with the second qubit,
a fourth qubit coupleable with the third qubit,
a fifth qubit coupleable with the fourth qubit,
a sixth qubit coupleable with the fifth qubit,
a seventh qubit coupleable with the sixth qubit,
an eighth qubit coupleable with the seventh qubit, and
a ninth qubit coupleable with the eighth qubit, the controller being configured to perform a first control,
the first control including encoding a surface code having a code distance of 3 by
performing a two-qubit gate on the second and first qubits,
performing a two-qubit gate on the third and second qubits,
performing a two-qubit gate on the fourth and third qubits,
performing a two-qubit gate on the fourth and fifth qubits,
performing a two-qubit gate on the sixth and fifth qubits,
performing a two-qubit gate on the sixth and seventh qubits, performing a two-qubit gate on the seventh and eighth qubits, and performing a two-qubit gate on the eighth and ninth qubits, in the first control, the controller performing the two-qubit gate on the third and second qubits after the two-qubit gate for the second and first qubits and the two-qubit gate for the fourth and third qubits, in the first control, the controller performing the two-qubit gate on the seventh and eighth qubits after the two-qubit gate for the sixth and seventh qubits and the two-qubit gate for the eighth and ninth qubits.

Configuration 2

The encoder according to Configuration 1, wherein the first control includes a first partial control, and a second partial control after the first partial control, the first partial control includes:
  the performing of the two-qubit gate on the second and first qubits;
  the performing of the two-qubit gate on the fourth and third qubits;
  the performing of the two-qubit gate on the fourth and fifth qubits;
  the performing of the two-qubit gate on the sixth and fifth qubits;
  the performing of the two-qubit gate on the sixth and seventh qubits; and
  the performing of the two-qubit gate on the eighth and ninth qubits, and the second partial control includes:
  the performing of the two-qubit gate on the third and second qubits; and
  the performing of the two-qubit gate on the seventh and eighth qubits.

Configuration 3

The encoder according to Configuration 1, wherein the first control includes a first partial control, a second partial control after the first partial control, and a third partial control after the second partial control, the first partial control includes:
  the performing of the two-qubit gate on the second and first qubits;
  the performing of the two-qubit gate on the fourth and third qubits;
  the performing of the two-qubit gate on the sixth and seventh qubits; and
  the performing of the two-qubit gate on the eighth and ninth qubits, the second partial control includes:
  the performing of the two-qubit gate on the third and second qubits; and
  the performing of the two-qubit gate on the fourth and fifth qubits, and the third partial control includes:
  the performing of the two-qubit gate on the sixth and fifth qubits; and
  the performing of the two-qubit gate on the seventh and eighth qubits.

Configuration 4

The encoder according to Configuration 1, wherein the first control includes a first partial control, a second partial control after the first partial control, and a third partial control after the second partial control, the first partial control includes:
  the performing of the two-qubit gate on the second and first qubits;
  the performing of the two-qubit gate on the fourth and third qubits;
  the performing of the two-qubit gate on the sixth and fifth qubits; and
  the performing of the two-qubit gate on the eighth and ninth qubits, the second partial control includes:
  the performing of the two-qubit gate on the fourth and fifth qubits; and
  the performing of the two-qubit gate on the sixth and seventh qubits, and the third partial control includes:
  the performing of the two-qubit gate on the third and second qubits; and
  the performing of the two-qubit gate on the seventh and eighth qubits.

Configuration 5

An encoder, comprising:
an encoded element part; and
a controller,
the encoded element part including
  a first encoded qubit having a code distance of N,
  a second encoded qubit coupleable with the first encoded qubit, the second encoded qubit having the code distance of N,
  a third encoded qubit coupleable with the second encoded qubit, the third encoded qubit having the code distance of N,
  a fourth encoded qubit coupleable with the third encoded qubit, the fourth encoded qubit having the code distance of N,
  a fifth encoded qubit coupleable with the fourth encoded qubit, the fifth encoded qubit having the code distance of N,
  a sixth encoded qubit coupleable with the fifth encoded qubit, the sixth encoded qubit having the code distance of N,
  a seventh encoded qubit coupleable with the sixth encoded qubit, the seventh encoded qubit having the code distance of N,
  an eighth encoded qubit coupleable with the seventh encoded qubit, the eighth encoded qubit having the code distance of N, and
  a ninth encoded qubit coupleable with the eighth encoded qubit, the ninth encoded qubit having the code distance of N, N being an integer not less than 2, the controller being configured to perform a second control and a third control, the second control including encoding a code having a code distance of 3N, the code being formed by concatenating a code having the code distance of N and a surface code having a code distance of 3, the encoding including
  performing an encoded two-qubit gate on the second and first encoded qubits,
  performing an encoded two-qubit gate on the third and second encoded qubits,
  performing an encoded two-qubit gate on the fourth and third encoded qubits,
  performing an encoded two-qubit gate on the fourth and fifth encoded qubits,
  performing an encoded two-qubit gate on the sixth and fifth encoded qubits, performing an encoded two-qubit gate on the sixth and seventh encoded qubits,
performing an encoded two-qubit gate on the seventh and eighth encoded qubits,
performing an encoded two-qubit gate on the eighth and ninth encoded qubits,
in the second control, the controller performing the encoded two-qubit gate on the third and second encoded qubits after the encoded two-qubit gate for the second and first encoded qubits and the encoded two-qubit gate for the fourth and third encoded qubits,
in the second control, the controller performing the encoded two-qubit gate on the seventh and eighth encoded qubits after the encoded two-qubit gate for the sixth and seventh encoded qubits and the encoded two-qubit gate for the eighth and ninth encoded qubits,
the controller performing the third control after the second control,
the third control including detecting an error in at least one of the second encoded qubit, the third encoded qubit, or the fourth encoded qubit and in at least one of the sixth encoded qubit, the seventh encoded qubit, or the eighth encoded qubit,
the controller repeating the second and third controls until the error is not detected.

Configuration 6
The encoder according to Configuration 5, wherein
each of the first to ninth encoded qubits includes a first element part,
the first element part includes:
a first qubit;
a second qubit coupleable with the first qubit;
a third qubit coupleable with the second qubit;
a fourth qubit coupleable with the third qubit;
a fifth qubit coupleable with the fourth qubit;
a sixth qubit coupleable with the fifth qubit;
a seventh qubit coupleable with the sixth qubit;
an eighth qubit coupleable with the seventh qubit; and
a ninth qubit coupleable with the eighth qubit, the controller is configured to perform a first control,
the first control includes encoding a surface code having the code distance of 3 by:
performing a two-qubit gate on the second and first qubits;
performing a two-qubit gate on the third and second qubits;
performing a two-qubit gate on the fourth and third qubits;
performing a two-qubit gate on the fourth and fifth qubits;
performing a two-qubit gate on the sixth and fifth qubits;
performing a two-qubit gate on the sixth and seventh qubits;
performing a two-qubit gate on the seventh and eighth qubits; and
performing a two-qubit gate on the eighth and ninth qubits,
a code having the code distance of N is a surface code having the code distance of 3,
in the first control, the controller performs the two-qubit gate on the third and second qubits after the two-qubit gate for the second and first qubits and the two-qubit gate for the fourth and third qubits, and
in the first control, the controller performs the two-qubit gate on the seventh and eighth qubits after the two-qubit gate for the sixth and seventh qubits and the two-qubit gate for the eighth and ninth qubits.

Configuration 7
The encoder according to Configuration 5 or 6, wherein the third control further includes detecting an error in the fifth and eighth encoded qubits.

Configuration 8
An encoder, comprising:
an encoded element part; and
a controller,
the encoded element part including
a first encoded qubit having a code distance of N,
a second encoded qubit coupleable with the first encoded qubit, the second encoded qubit having the code distance of N,
a third encoded qubit coupleable with the second encoded qubit, the third encoded qubit having the code distance of N,
a fourth encoded qubit coupleable with the third encoded qubit, the fourth encoded qubit having the code distance of N,
a fifth encoded qubit coupleable with the fourth encoded qubit, the fifth encoded qubit having the code distance of N,
a sixth encoded qubit coupleable with the fifth encoded qubit, the sixth encoded qubit having the code distance of N,
a seventh encoded qubit coupleable with the sixth encoded qubit, the seventh encoded qubit having the code distance of N,
an eighth encoded qubit coupleable with the seventh encoded qubit, the eighth encoded qubit having the code distance of N, and
a ninth encoded qubit coupleable with the eighth encoded qubit, the ninth encoded qubit having the code distance of N,
the controller being configured to perform a second control and a third control,
the second control including encoding a code having a code distance of 3N, the code being formed by concatenating a code having the code distance of N and a surface code having a code distance of 3, the encoding including
performing an encoded two-qubit gate on the second and first encoded qubits,
performing an encoded two-qubit gate on the third and second encoded qubits,
performing an encoded two-qubit gate on the fourth and third encoded qubits,
performing an encoded two-qubit gate on the fourth and fifth encoded qubits,
performing an encoded two-qubit gate on the sixth and fifth encoded qubits,
performing an encoded two-qubit gate on the sixth and seventh encoded qubits,
performing an encoded two-qubit gate on the seventh and eighth encoded qubits, and
performing an encoded two-qubit gate on the eighth and ninth encoded qubits,
in the second control, the controller performing the encoded two-qubit gate on the third and second encoded qubits after the encoded two-qubit gate for the second and first encoded qubits and the encoded two-qubit gate for the fourth and third encoded qubits,
in the second control, the controller performing the encoded two-qubit gate on the seventh and eighth encoded qubits after the encoded two-qubit gate for the sixth and seventh encoded qubits and the encoded two-qubit gate for the eighth and ninth encoded qubits, the controller performing the third control after the second control, the third control including detecting an error in the second, fifth, and eighth encoded qubits, the controller repeating the second and third controls until the error is not detected.

Configuration 9

The encoder according to Configuration 8, wherein each of the first to ninth encoded qubits includes a first element part, the first element part includes:
a first qubit;
a second qubit coupleable with the first qubit;
a third qubit coupleable with the second qubit;
a fourth qubit coupleable with the third qubit;
a fifth qubit coupleable with the fourth qubit;
a sixth qubit coupleable with the fifth qubit;
a seventh qubit coupleable with the sixth qubit;
an eighth qubit coupleable with the seventh qubit; and
a ninth qubit coupleable with the eighth qubit, the controller is configured to perform a first control, the first control includes encoding a surface code having the code distance of 3 by
performing a two-qubit gate on the second and first qubits,
performing a two-qubit gate on the third and second qubits,
performing a two-qubit gate on the fourth and third qubits,
performing a two-qubit gate on the fourth and fifth qubits,
performing a two-qubit gate on the sixth and fifth qubits,
performing a two-qubit gate on the sixth and seventh qubits,
performing a two-qubit gate on the seventh and eighth qubits, and
performing a two-qubit gate on the eighth and ninth qubits, a code having the code distance of N is a surface code having the code distance of 3, in the first control, the controller performs the two-qubit gate on the third and second qubits after the two-qubit gate for the second and first qubits and the two-qubit gate for the fourth and third qubits, and in the first control, the controller performs the two-qubit gate on the seventh and eighth qubits after the two-qubit gate for the sixth and seventh qubits and the two-qubit gate for the eighth and ninth qubits.

Configuration 10

A calculating device, comprising:
the encoder according to any one of Configurations 1 to 4.

Configuration 11

The calculating device according to Configuration 10, wherein
states of the first to ninth qubits correspond to quantum states of atoms trapped by light.

Configuration 12

A calculating device, comprising:
the encoder according to any one of Configurations 5 to 9, an encoded qubit obtained by the second and third controls being used in a calculation.

Configuration 13

The calculating device according to Configuration 12, wherein
states of the first to ninth encoded qubits correspond to quantum states of atoms trapped by light.

Configuration 14

An encoding method, comprising:
performing a first control on a first element part,
the first control encoding a surface code having a code distance of 3,
the first element part including
a first qubit,
a second qubit coupleable with the first qubit,
a third qubit coupleable with the second qubit,
a fourth qubit coupleable with the third qubit,
a fifth qubit coupleable with the fourth qubit,
a sixth qubit coupleable with the fifth qubit,
a seventh qubit coupleable with the sixth qubit,
an eighth qubit coupleable with the seventh qubit, and
a ninth qubit coupleable with the eighth qubit, the first control including
performing a two-qubit gate on the second and first qubits,
performing a two-qubit gate on the third and second qubits,
performing a two-qubit gate on the fourth and third qubits,
performing a two-qubit gate on the fourth and fifth qubits,
performing a two-qubit gate on the sixth and fifth qubits,
performing a two-qubit gate on the sixth and seventh qubits,
performing a two-qubit gate on the seventh and eighth qubits, and
performing a two-qubit gate on the eighth and ninth qubits, in the first control, the two-qubit gate being performed on the third and second qubits after the two-qubit gate for the second and first qubits and the two-qubit gate for the fourth and third qubits, in the first control, the two-qubit gate being performed on the seventh and eighth qubits after the two-qubit gate for the sixth and seventh qubits and the two-qubit gate for the eighth and ninth qubits.

According to embodiments, an encoder, a calculating device, and an encoding method can be provided in which the efficiency can be increased.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in encoders or calculating devices, such as element parts, qubits, controllers etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all encoders, calculating devices, and encoding methods practicable by an appropriate design modification by one skilled in the art based on the encoders, the calculating devices, and the encoding methods described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An encoder, comprising:
    a first element part; and
    a controller,
    the first element part including
        a first qubit,
        a second qubit coupleable with the first qubit,
        a third qubit coupleable with the second qubit,
        a fourth qubit coupleable with the third qubit,
        a fifth qubit coupleable with the fourth qubit,
        a sixth qubit coupleable with the fifth qubit,
        a seventh qubit coupleable with the sixth qubit,
        an eighth qubit coupleable with the seventh qubit, and
        a ninth qubit coupleable with the eighth qubit,
    the controller being configured to perform a first control,
    the first control including encoding a surface code having
        a code distance of 3 by
        performing a two-qubit gate on the second and first qubits,
        performing a two-qubit gate on the third and second qubits,
        performing a two-qubit gate on the fourth and third qubits,
        performing a two-qubit gate on the fourth and fifth qubits,
        performing a two-qubit gate on the sixth and fifth qubits,
        performing a two-qubit gate on the sixth and seventh qubits,
        performing a two-qubit gate on the seventh and eighth qubits, and
        performing a two-qubit gate on the eighth and ninth qubits,
    in the first control, the controller performing the two-qubit gate on the third and second qubits after the two-qubit gate for the second and first qubits and the two-qubit gate for the fourth and third qubits,
    in the first control, the controller performing the two-qubit gate on the seventh and eighth qubits after the two-qubit gate for the sixth and seventh qubits and the two-qubit gate for the eighth and ninth qubits.

2. The encoder according to claim 1, wherein
    in the first control, the controller is configured to perform a first partial control and a second partial control after the first partial control,
    the first partial control includes:
        the performing of the two-qubit gate on the second and first qubits;
        the performing of the two-qubit gate on the fourth and third qubits;
        the performing of the two-qubit gate on the fourth and fifth qubits;
        the performing of the two-qubit gate on the sixth and fifth qubits;
        the performing of the two-qubit gate on the sixth and seventh qubits; and
        the performing of the two-qubit gate on the eighth and ninth qubits, and
    the second partial control includes:
        the performing of the two-qubit gate on the third and second qubits; and
        the performing of the two-qubit gate on the seventh and eighth qubits.

3. The encoder according to claim 1, wherein
    in the first control, the controller is configured to perform a first partial control, a second partial control after the first partial control, and a third partial control after the second partial control,
    the first partial control includes:
        the performing of the two-qubit gate on the second and first qubits;
        the performing of the two-qubit gate on the fourth and third qubits;
        the performing of the two-qubit gate on the sixth and seventh qubits; and
        the performing of the two-qubit gate on the eighth and ninth qubits,
    the second partial control includes:
        the performing of the two-qubit gate on the third and second qubits; and
        the performing of the two-qubit gate on the fourth and fifth qubits, and
    the third partial control includes:
        the performing of the two-qubit gate on the sixth and fifth qubits; and
        the performing of the two-qubit gate on the seventh and eighth qubits.

4. The encoder according to claim 1, wherein
    in the first control, the controller is configured to perform a first partial control, a second partial control after the first partial control, and a third partial control after the second partial control,
    the first partial control includes:
        the performing of the two-qubit gate on the second and first qubits;
        the performing of the two-qubit gate on the fourth and third qubits;
        the performing of the two-qubit gate on the sixth and fifth qubits; and
        the performing of the two-qubit gate on the eighth and ninth qubits,
    the second partial control includes:
        the performing of the two-qubit gate on the fourth and fifth qubits; and
        the performing of the two-qubit gate on the sixth and seventh qubits, and
    the third partial control includes:
        the performing of the two-qubit gate on the third and second qubits; and
        the performing of the two-qubit gate on the seventh and eighth qubits.

5. A calculating device, comprising:
the encoder according to claim 1.

6. The calculating device according to claim 5, wherein states of the first to ninth qubits correspond to quantum states of atoms trapped by light.

7. An encoder, comprising:
an encoded element part; and
a controller,
the encoded element part including
- a first encoded qubit having a code distance of N,
- a second encoded qubit coupleable with the first encoded qubit,
the second encoded qubit having the code distance of N,
- a third encoded qubit coupleable with the second encoded qubit, the third encoded qubit having the code distance of N,
- a fourth encoded qubit coupleable with the third encoded qubit,
the fourth encoded qubit having the code distance of N,
- a fifth encoded qubit coupleable with the fourth encoded qubit,
the fifth encoded qubit having the code distance of N,
- a sixth encoded qubit coupleable with the fifth encoded qubit,
the sixth encoded qubit having the code distance of N,
- a seventh encoded qubit coupleable with the sixth encoded qubit, the seventh encoded qubit having the code distance of N,
- an eighth encoded qubit coupleable with the seventh encoded qubit, the eighth encoded qubit having the code distance of N, and
- a ninth encoded qubit coupleable with the eighth encoded qubit, the ninth encoded qubit having the code distance of N, N being an integer not less than 2,
the controller being configured to perform a second control and a third control,
the second control including encoding a code having a code distance of 3N, the code being formed by concatenating a code having the code distance of N and a surface code having a code distance of 3, the encoding including
- performing an encoded two-qubit gate on the second and first encoded qubits,
- performing an encoded two-qubit gate on the third and second encoded qubits,
- performing an encoded two-qubit gate on the fourth and third encoded qubits,
- performing an encoded two-qubit gate on the fourth and fifth encoded qubits,
- performing an encoded two-qubit gate on the sixth and fifth encoded qubits,
- performing an encoded two-qubit gate on the sixth and seventh encoded qubits,
- performing an encoded two-qubit gate on the seventh and eighth encoded qubits,
- performing an encoded two-qubit gate on the eighth and ninth encoded qubits, in the second control, the controller performing the encoded two-qubit gate on the third and second encoded qubits after the encoded two-qubit gate for the second and first encoded qubits and the encoded two-qubit gate for the fourth and third encoded qubits,
in the second control, the controller performing the encoded two-qubit gate on the seventh and eighth encoded qubits after the encoded two-qubit gate for the sixth and seventh encoded qubits and the encoded two-qubit gate for the eighth and ninth encoded qubits,
the controller performing the third control after the second control,
the third control including detecting an error in at least one of the second encoded qubit, the third encoded qubit, or the fourth encoded qubit and in at least one of the sixth encoded qubit, the seventh encoded qubit, or the eighth encoded qubit,
the controller repeating the second and third controls until the error is not detected.

8. The encoder according to claim 7, wherein
each of the first to ninth encoded qubits includes a first element part,
the first element part includes:
- a first qubit;
- a second qubit coupleable with the first qubit;
- a third qubit coupleable with the second qubit;
- a fourth qubit coupleable with the third qubit;
- a fifth qubit coupleable with the fourth qubit;
- a sixth qubit coupleable with the fifth qubit;
- a seventh qubit coupleable with the sixth qubit;
- an eighth qubit coupleable with the seventh qubit; and
- a ninth qubit coupleable with the eighth qubit,
the controller is configured to perform a first control,
the first control includes encoding a surface code having the code distance of 3 by:
- performing a two-qubit gate on the second and first qubits;
- performing a two-qubit gate on the third and second qubits;
- performing a two-qubit gate on the fourth and third qubits;
- performing a two-qubit gate on the fourth and fifth qubits;
- performing a two-qubit gate on the sixth and fifth qubits;
- performing a two-qubit gate on the sixth and seventh qubits;
- performing a two-qubit gate on the seventh and eighth qubits; and
- performing a two-qubit gate on the eighth and ninth qubits, a code having the code distance of N is a surface code having the code distance of 3,
in the first control, the controller performs the two-qubit gate on the third and second qubits after the two-qubit gate for the second and first qubits and the two-qubit gate for the fourth and third qubits, and
in the first control, the controller performs the two-qubit gate on the seventh and eighth qubits after the two-qubit gate for the sixth and seventh qubits and the two-qubit gate for the eighth and ninth qubits.

9. The encoder according to claim 7, wherein
the third control further includes detecting an error in the fifth and eighth encoded qubits.

10. An encoder, comprising:
an encoded element part; and
a controller,
the encoded element part including
- a first encoded qubit having a code distance of N,
- a second encoded qubit coupleable with the first encoded qubit, the second encoded qubit having the code distance of N,
- a third encoded qubit coupleable with the second encoded qubit, the third encoded qubit having the code distance of N, a fourth encoded qubit coupleable with the third encoded qubit, the fourth encoded qubit having the code distance of N,
a fifth encoded qubit coupleable with the fourth encoded qubit, the fifth encoded qubit having the code distance of N,
a sixth encoded qubit coupleable with the fifth encoded qubit, the sixth encoded qubit having the code distance of N,
a seventh encoded qubit coupleable with the sixth encoded qubit, the seventh encoded qubit having the code distance of N,
an eighth encoded qubit coupleable with the seventh encoded qubit, the eighth encoded qubit having the code distance of N, and
a ninth encoded qubit coupleable with the eighth encoded qubit, the ninth encoded qubit having the code distance of N,
the controller being configured to perform a second control and a third control,
the second control including encoding a code having a code distance of 3N, the code being formed by concatenating a code having the code distance of N and a surface code having a code distance of 3, the encoding including
performing an encoded two-qubit gate on the second and first encoded qubits,
performing an encoded two-qubit gate on the third and second encoded qubits,
performing an encoded two-qubit gate on the fourth and third encoded qubits,
performing an encoded two-qubit gate on the fourth and fifth encoded qubits,
performing an encoded two-qubit gate on the sixth and fifth encoded qubits,
performing an encoded two-qubit gate on the sixth and seventh encoded qubits,
performing an encoded two-qubit gate on the seventh and eighth encoded qubits, and
performing an encoded two-qubit gate on the eighth and ninth encoded qubits,
in the second control, the controller performing the encoded two-qubit gate on the third and second encoded qubits after the encoded two-qubit gate for the second and first encoded qubits and the encoded two-qubit gate for the fourth and third encoded qubits,
in the second control, the controller performing the encoded two-qubit gate on the seventh and eighth encoded qubits after the encoded two-qubit gate for the sixth and seventh encoded qubits and the encoded two-qubit gate for the eighth and ninth encoded qubits,
the controller performing the third control after the second control,
the third control including detecting an error in the second, fifth, and eighth encoded qubits,
the controller repeating the second and third controls until the error is not detected.

11. The encoder according to claim 10, wherein
each of the first to ninth encoded qubits includes a first element part,
the first element part includes:
a first qubit;
a second qubit coupleable with the first qubit;
a third qubit coupleable with the second qubit;
a fourth qubit coupleable with the third qubit;
a fifth qubit coupleable with the fourth qubit;
a sixth qubit coupleable with the fifth qubit;
a seventh qubit coupleable with the sixth qubit;
an eighth qubit coupleable with the seventh qubit; and
a ninth qubit coupleable with the eighth qubit,
the controller is configured to perform a first control,
the first control includes encoding a surface code having the code distance of 3 by
performing a two-qubit gate on the second and first qubits,
performing a two-qubit gate on the third and second qubits,
performing a two-qubit gate on the fourth and third qubits,
performing a two-qubit gate on the fourth and fifth qubits,
performing a two-qubit gate on the sixth and fifth qubits,
performing a two-qubit gate on the sixth and seventh qubits,
performing a two-qubit gate on the seventh and eighth qubits, and
performing a two-qubit gate on the eighth and ninth qubits,
a code having the code distance of N is a surface code having the code distance of 3,
in the first control, the controller performs the two-qubit gate on the third and second qubits after the two-qubit gate for the second and first qubits and the two-qubit gate for the fourth and third qubits, and
in the first control, the controller performs the two-qubit gate on the seventh and eighth qubits after the two-qubit gate for the sixth and seventh qubits and the two-qubit gate for the eighth and ninth qubits.

12. A calculating device, comprising:
the encoder according to claim 7,
an encoded qubit obtained by the second and third controls being used in a calculation.

13. The calculating device according to claim 12, wherein
states of the first to ninth encoded qubits correspond to quantum states of atoms trapped by light.

14. An encoding method, comprising:
performing a first control on a first element part,
the first control encoding a surface code having a code distance of 3,
the first element part including
a first qubit,
a second qubit coupleable with the first qubit,
a third qubit coupleable with the second qubit,
a fourth qubit coupleable with the third qubit,
a fifth qubit coupleable with the fourth qubit,
a sixth qubit coupleable with the fifth qubit,
a seventh qubit coupleable with the sixth qubit,
an eighth qubit coupleable with the seventh qubit, and
a ninth qubit coupleable with the eighth qubit,
the first control including
performing a two-qubit gate on the second and first qubits,
performing a two-qubit gate on the third and second qubits,
performing a two-qubit gate on the fourth and third qubits,
performing a two-qubit gate on the fourth and fifth qubits,
performing a two-qubit gate on the sixth and fifth qubits,
performing a two-qubit gate on the sixth and seventh qubits, performing a two-qubit gate on the seventh and eighth qubits, and performing a two-qubit gate on the eighth and ninth qubits, in the first control, the two-qubit gate being performed on the third and second qubits after the two-qubit gate for the second and first qubits and the two-qubit gate for the fourth and third qubits, in the first control, the two-qubit gate being performed on the seventh and eighth qubits after the two-qubit gate for the sixth and seventh qubits and the two-qubit gate for the eighth and ninth qubits.

* * * * *